United States Patent [19]

Ando

[11] Patent Number: 5,459,638
[45] Date of Patent: Oct. 17, 1995

[54] SEMICONDUCTOR DEVICE WITH HEAT RADIATING FIN ASSEMBLY AND CONTAINER FOR HOUSING THE SAME

[75] Inventor: Yukio Ando, Kawasaki, Japan

[73] Assignee: Fujitsu Limited, Kawasaki, Japan

[21] Appl. No.: 356,050

[22] Filed: Dec. 14, 1994

Related U.S. Application Data

[63] Continuation of Ser. No. 167,116, Dec. 16, 1993, abandoned, which is a continuation of Ser. No. 856,074, filed as PCT/JP91/01221 Sept. 13, 1991, abandoned.

[30] Foreign Application Priority Data

Sep. 13, 1990 [JP] Japan ..................... 2-245044

[51] Int. Cl.$^6$ .................................. H05K 7/20
[52] U.S. Cl. .................. 361/703; 174/16.3; 257/707; 361/727
[58] Field of Search ..................... 257/706, 707, 257/713; 174/16.3, 52.4; 165/80.3, 185; 211/41; 439/68, 485, 487, 892, 893; 361/703, 688, 690, 697, 704, 705, 707, 718, 719, 724, 725, 727, 736, 741, 773, 796, 807, 809

[56] References Cited

U.S. PATENT DOCUMENTS

| | | | |
|---|---|---|---|
| 4,366,526 | 12/1982 | Lijoi | 361/385 |
| 4,535,384 | 8/1985 | Wakabayashi | 361/386 |
| 4,546,407 | 10/1985 | Benenati | 361/386 |
| 5,007,858 | 4/1991 | Daly | 439/485 |
| 5,019,940 | 5/1991 | Clemens | 361/386 |
| 5,055,914 | 10/1991 | Shimizu | 361/381 |
| 5,077,638 | 12/1991 | Andersson | 361/388 |
| 5,132,875 | 7/1992 | Plesinger | 361/386 |
| 5,375,652 | 12/1994 | Matsunaga | 361/703 |

FOREIGN PATENT DOCUMENTS

| | | | |
|---|---|---|---|
| 59-43276 | 12/1984 | Japan . | |
| 64-17993 | 1/1989 | Japan . | |
| 1-158494 | 11/1989 | Japan . | |
| 2144998 | 6/1990 | Japan | 361/703 |
| 2-93290 | 7/1990 | Japan . | |

Primary Examiner—Gerald P. Tolin
Attorney, Agent, or Firm—Staas & Halsey

[57] ABSTRACT

A semiconductor device is provided with a rectangular package body, a large number of leads projecting out from the body, and a heat radiating fin assembly on top of the package body. The heat radiating fin assembly is constructed of a support column extending vertically from the top surface of the package body and at least one heat radiating fin extending outwardly from the support column in a radial direction. The heat radiating fin is supported by direct or indirect engagement within a container for accommodating and holding the semiconductor device. The support is achieved in such a way that the leads of the device are held out of contact with the inside of the container and such that the device is accommodated and held within the container in a predetermined orientation.

15 Claims, 10 Drawing Sheets

SEMICONDUCTOR DEVICE WITH HEAT RADIATING FIN ASSEMBLY AND CONTAINER FOR HOUSING THE SAME

This application is a continuation of application Ser. No. 08/167,116, filed Dec. 16, 1993, now abandoned, which is a continuation of Ser. No. 856,074, filed as PCT/JP91/01221, Sept. 13, 1991, now abandoned.

TECHNICAL FIELD

The present invention relates to a semiconductor device with a heat radiating fin assembly and to a container for housing the same.

BACKGROUND ART

In general, semiconductor devices include a block shaped package body in which an IC chip is sealed and a large number of leads which project out from the opposing sides of the package body and are electrically connected to the IC chip. Various types of packages for semiconductor devices are known. As typical examples, mention may be made of SOP (small outline packages), QFP (quad flat packages), and PGA (pin grid array packages).

In recent years, progress has been made in making semiconductor devices higher in density. Along with this, the amount of heat generated in such devices has increased and therefore it is becoming difficult to sufficiently cool the semiconductor devices by radiation of heat from the package body itself. Therefore, heat radiating fin assemblies are being attached to the package body so as to enable efficient radiation of heat from the semiconductor devices. Usually, a heat radiating assembly is constructed of a support column which is designed to be affixed to the package body of a semiconductor device and a large number of fins which extend from the support column in the radial direction and are arranged at equal intervals along the axial direction of the support column.

In a high density semiconductor device, the pitch of the arrangement of the large number of leads projecting out from the opposing sides of the package body is extremely small, therefore if even one of the leads is slightly deformed, it becomes impossible to accurately mount the semiconductor device on the printed circuit board. Therefore, when transporting this type of semiconductor device, it is necessary to provide protection so that the leads of the semiconductor device do not come into contact with human hands or other objects.

In the past, use has been made of a protective carrier for holding individual semiconductor devices so as to prevent damage to the leads of the semiconductor device during shipment. Such protective carriers include a frame for accommodating the package body of the semiconductor device and a lock mechanism for preventing the package body from falling out of the accommodating frame. Further, at the inside edge of the frame of the protective carrier, a large number of fine grooves are formed at the same pitch as the pitch of arrangement of the leads, so that the leads are accommodated in the fine grooves at the same time as the package body is accommodated in the frame. During shipment, the protective carriers containing respective semiconductor devices are placed in a tray or other container. As long as the semiconductor device remains in the protective carrier, damage to the leads can be avoided.

However, a problem with the method of shipment of semiconductor devices discussed above is that the transport costs are too high. Such protective carriers have a complicated structure and therefore are relatively expensive. Further, a protective carrier is required for each semiconductor device to be shipped.

Another problem with the use of protective carriers is that when the semiconductor device is mounted on a printed circuit board, manual labor is involved in removing the semiconductor device from the protective carrier. The leads are easily damaged when the semiconductor device is removed from the protective carrier, so considerable care must be taken when removing the semiconductor device manually. On the other hand, an automatic extraction machine for automatically extracting the semiconductor devices from the protective carriers in an automatic procedure would be very expensive.

Japanese Unexamined Utility Model Publication (Kokai) No. 1-158949 discloses a transport carrier which is able to hold a number of semiconductor devices having heat radiating fin assemblies. In this transport carrier, use is made of the heat radiating fin assembly to hold the semiconductor device. As mentioned in detail in such publication, the transport carrier is comprised of an elongated box-shaped casing, which is disposed with its longitudinal axis extending in a horizontal direction. The upper edge of the front wall of the box-shaped casing is connecting to the top wall by hinges so the casing can be freely opened or closed.

However, it is difficult to automatically remove semiconductor devices from such box-shaped casings and to supply them to an automatic semiconductor device mounting machine. That is to say, the support columns of the heat radiating fin assemblies are not constrained, so the semiconductor devices accommodated in the box-shaped casing cannot all be given the same orientation. While it might be possible to develop an automatic extraction machine able to automatically extract semiconductor devices oriented in different directions and give them a predetermined orientation, considerable cost would be required for developing such an automatic extraction machine.

DISCLOSURE OF THE INVENTION

Therefore, the main object of the present invention is to provide a semiconductor device having a rectangular package body, a large number of leads projecting out from the package body, and a heat radiating fin assembly mounted on top of the package body, and wherein the heat radiating fin assembly is adapted for accommodating and holding the package body in the container so that the leads are protected and the package body is oriented in a predetermined direction.

According to the present invention, the heat radiating fin assembly includes a support column extending vertically from the top surface of the package body and at least one heat radiating fin extending in the radial direction from the support column. The heat radiating fins are supported by direct or indirect engagement with the container, and such support is achieved in such a way that the leads which project out from the package body do not contact anything at all. Further, according to the present invention, there can be no change in the orientation of the semiconductor device after it is accommodated in the container in a predetermined direction.

BRIEF DESCRIPTION OF THE DRAWINGS

The present invention will be explained in further detail referring to the attached drawings.

BEST MODE FOR CARRYING OUT THE INVENTION

Figure 1:
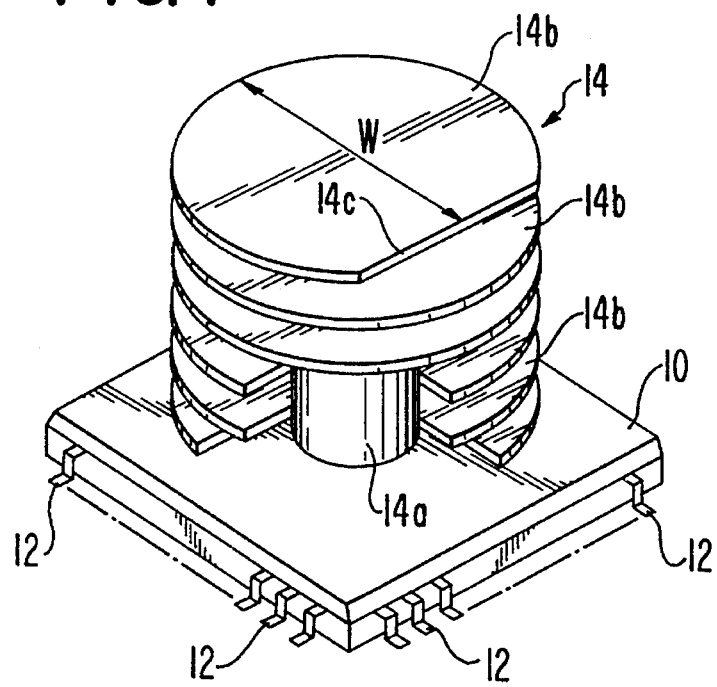
FIG. 1 is a perspective view of a first embodiment of the semiconductor device according to the present invention.
Figure 2:
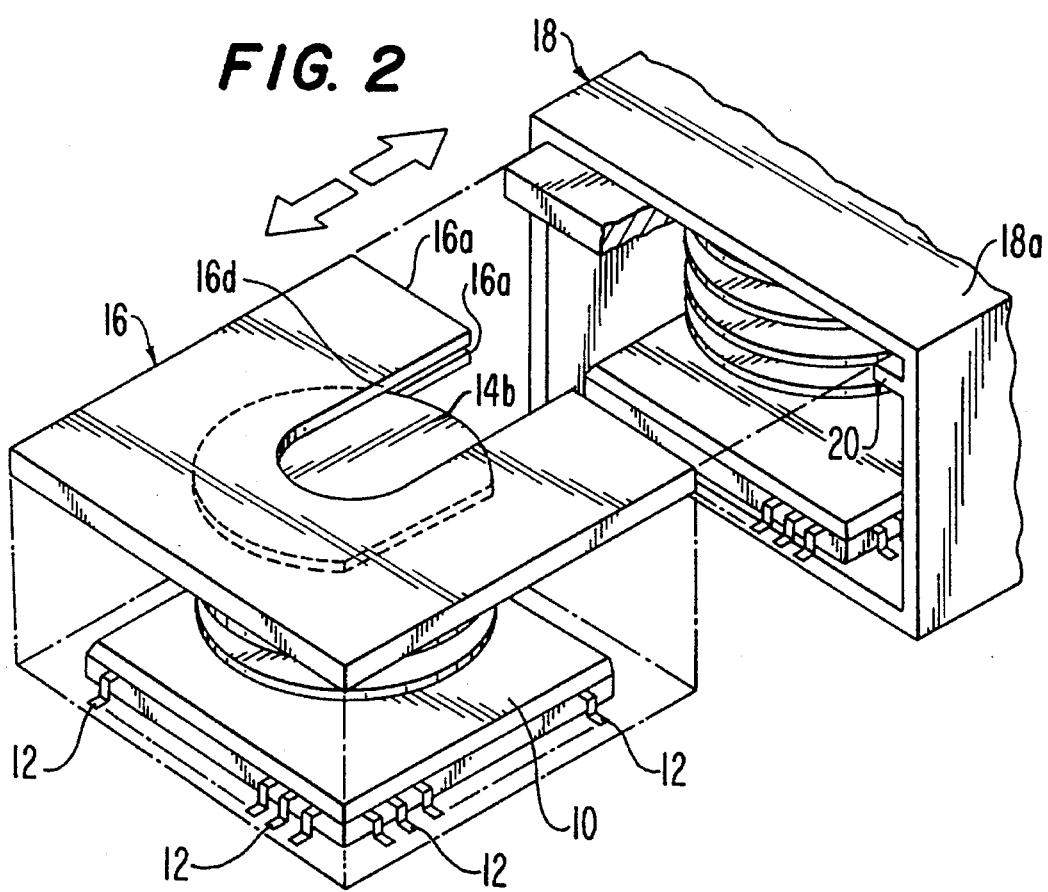
FIG. 2 is a perspective view of a plate-shaped member mounted on the topmost heat radiating fin of the heat radiating fin assembly of FIG. 1 and a portion of the box-shaped container for accommodating and holding the semiconductor device of FIG. 1.

Referring to FIG. 1 and FIG. 2, a first embodiment of the semiconductor device according to the present invention is shown. The semiconductor device of FIGS. 1 and 2 is of the type generally known as a QFP (Quad flat package). The semiconductor device] and includes a rectangular package body 10 in which an IC chip is sealed, a large number of leads 12 projecting out from the four sides of the package body 10, and a heat radiating fin assembly 14 mounted to the top surface of the package body 10. The package body 10 is formed, for example, from a plastic material or a ceramic material. The lead array constituted by the large number of leads 12 projecting out from the four sides of the package body 10 form overall a rectangular contour.

The heat radiating fin assembly 14 includes a support column 14a extending vertically from the top surface of the package body 10 and a plurality of heat radiating fins 14b which are integral with the support column 14a and extend outwardly therefrom in the radial direction. The fins 14b are arranged at equal intervals along the axial direction of the support column 14a. The support column 14a and the heat radiating fins 14b are formed from a metal material with good heat conductivity, for example, aluminum or copper. The support column 14a is, for example, soldered to a metal surface which is partially exposed at the top surface of the package body 10. Note that in this embodiment, as is clear from FIG. 1, the support column 14a is provided with a circular cross-sectional shape. The heat radiating fins 14b are also circular.

Figure 3:
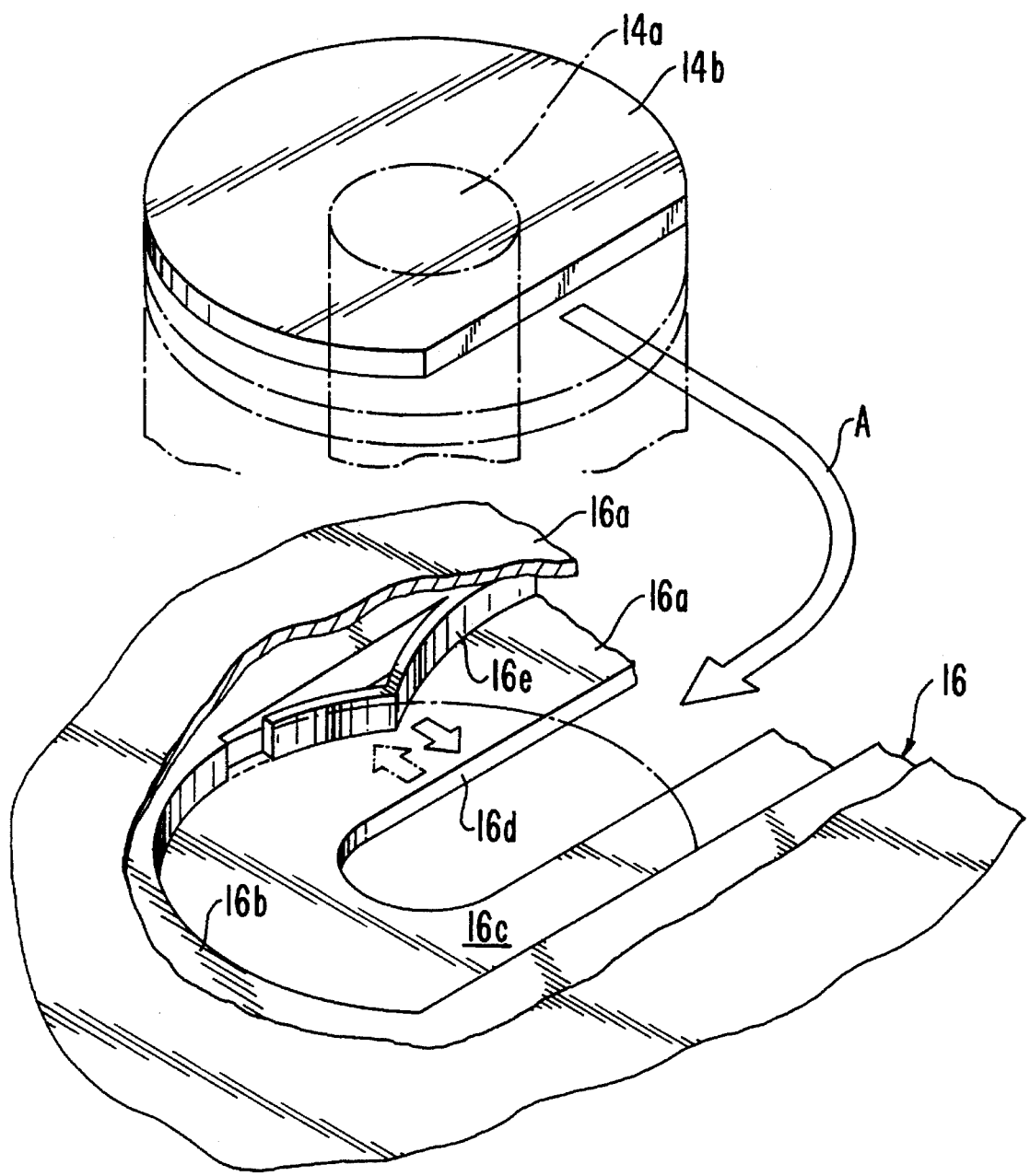
FIG. 3 is an enlarged view showing the plate-shaped member of FIG. 2 partially cut away.

As shown in FIG. 1, part of the topmost heat radiating fin 14b is cut away. The cutaway surface 14c is parallel to the side of the package body 10. As is clear from FIG. 2, the plate-shaped member 16 is made so as to be mounted on the topmost heat radiating fin 14b. As is best illustrated in FIG. 3, the plate-shaped member 16 is constituted of a pair of rectangular plate elements 16a and 16a' which are spaced from each other and a rectangular core element 16b which is positioned therebetween. These elements 16a, 16a' and 16b are preferably formed from a hard plastic material and are joined together integrally.

A cavity 16c is formed in the plate-shaped member 16, which cavity 16c extends from the center location at one side of the plate-shaped member 16 past the center of the same. The width of the cavity 16c is somewhat larger than the width W (FIG. 1) of the topmost heat radiating fin 14b. Further, as is clear from FIGS. 1 and 3, long cutaway portions 16d and 16d' are formed in the pair of rectangular plate elements 16a and 16a', which cutaway portions are arranged at the center of the cavity 16c and extend past the center of the plate-shaped member 16. The widths of the cutaway portions 16d and 16d' are somewhat larger than the diameter of the support column 14a of the heat radiating fin assembly 14. By this construction, it is possible to accommodate the topmost heat radiating fin 14b in the cavity 16c as shown by the arrow A in FIG. 3.

FIG. 2 shows the state with the topmost heat radiating fin 14b positioned in the cavity 16c. At this time, the center of the topmost heat radiating fin 14b substantially coincides with the center of the plate-shaped member 16. As shown in FIG. 3, at one of the side walls forming the cavity 16c, a flat spring element 16e is integrally formed. When the heat radiating fin 14b is completely accommodated in the cavity 16c, the flat spring element 16e snap engages with the heat radiating fin 14b. Therefore, after the topmost heat radiating in 14b has been inserted into the cavity 16c, a suitable force must be exerted on the heat radiating fin 14b to pull it out of the cavity 16c. The point to be noted here is that the cutaway portion 14c of the heating radiating fin 14b is engaged with the other side wall formed by the cavity 16c, so that the heat radiating fin 14b is not able to rotate or be displaced in the cavity 16c. In other words, since the heat radiating in 14b is accommodated in the cavity 16c, the package body 10 is oriented in a predetermined direction at all times with respect to the plate-shaped member 16.

Referring to FIG. 2, the box-shaped container 18 for accommodating and holding the semiconductor device is partially shown. This box-shaped container 18 is elongated and is open at one end as shown in FIG. 2. Guide elements 20 are provided at the inside surfaces of the two walls of the box-shaped container 18 along the longitudinal axial direction of the same (note that only one is shown in FIG. 2). When a plate-shaped member 16 is accommodated between these guide elements 20 and the top wall portion 18a of the box-shape container 18, the semiconductor device as a whole is hung from the plate-shaped member 16 and the leads 12 are out of contact with the inside surface of the bottom wall of the box-shaped container 18.

A plurality of semiconductor devices are held in the box-shaped container 18 in a mutually aligned state. The point to be noted here is that the plate-shaped member 16 has a rectangular configuration with outer dimensions which are larger than the outer dimensions of the lead array comprised of the large number of leads 12. Therefore, groups of leads, of two package bodies adjoining each other in the box-shaped container 18, projecting out toward each other will never come into contact. Note that in FIG. 2, the outer shape of the plate-shaped member 16 is shown by the broken line around the package body 10. Further, if a plate-shaped member 16 is accommodated between the guide elements 20 and the top wall 18*a* of the box-shaped container 18, the opposing side edges of the plate-shaped member 16 in the lateral direction will be engaged with the inside surfaces of the two side walls of the box-shaped container 18 and therefore the plate-shaped member 16 cannot rotate or change its position in the box-shaped container 18. That is, once the plate shaped member 16 is accommodated in the box-shaped container 18, the orientation of the plate-shaped member 16 will remain unchanged. Therefore, all of the plurality of semiconductor devices accommodated and held in the box-shaped container 18 can be given the same orientation.

Figure 4:
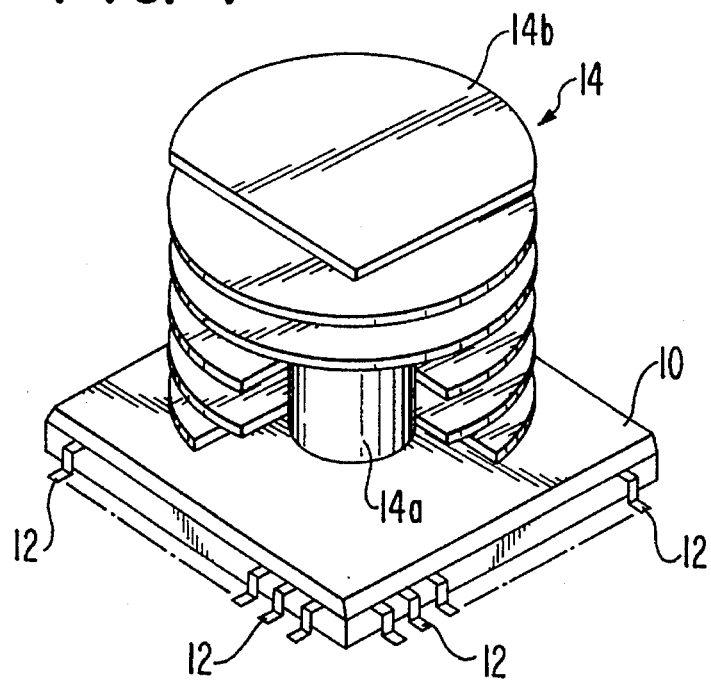
FIG. 4 is a perspective view similar to FIG. 1 and showing a modified embodiment of the semiconductor device of FIG. 1.
Figure 5:
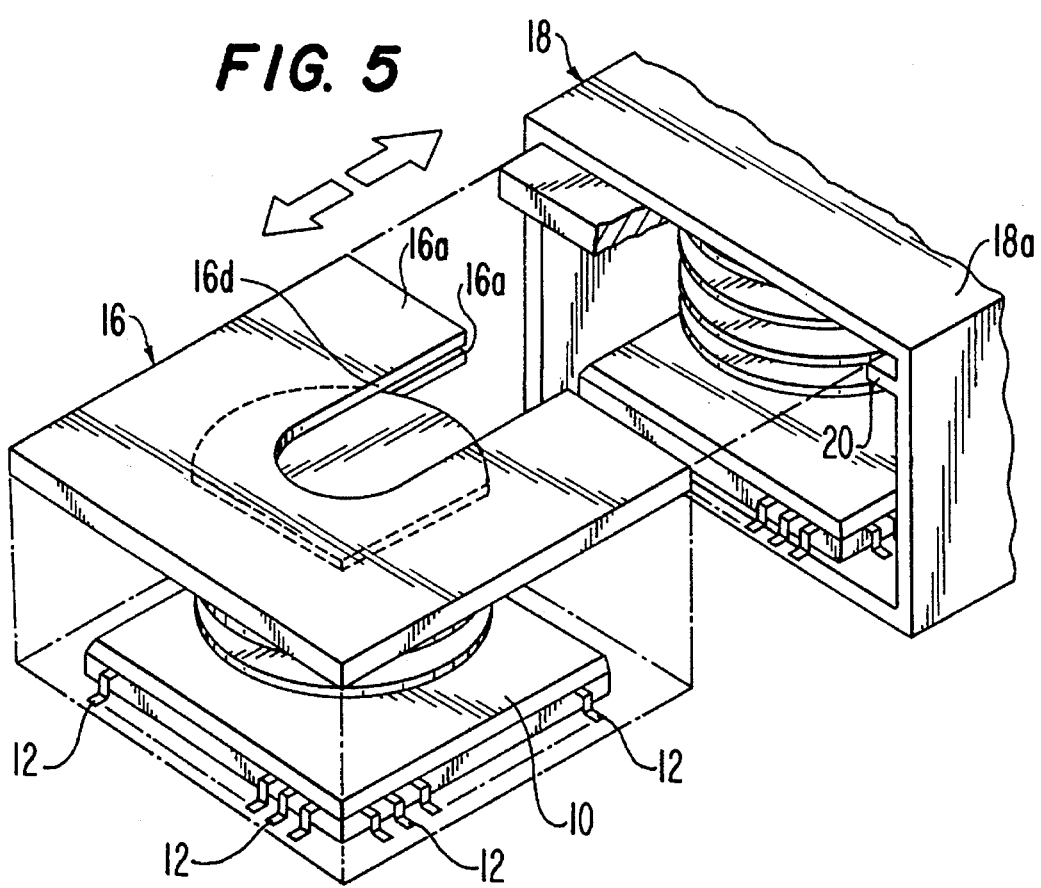
FIG. 5 is a perspective view corresponding to FIG. 2.
Figure 6:
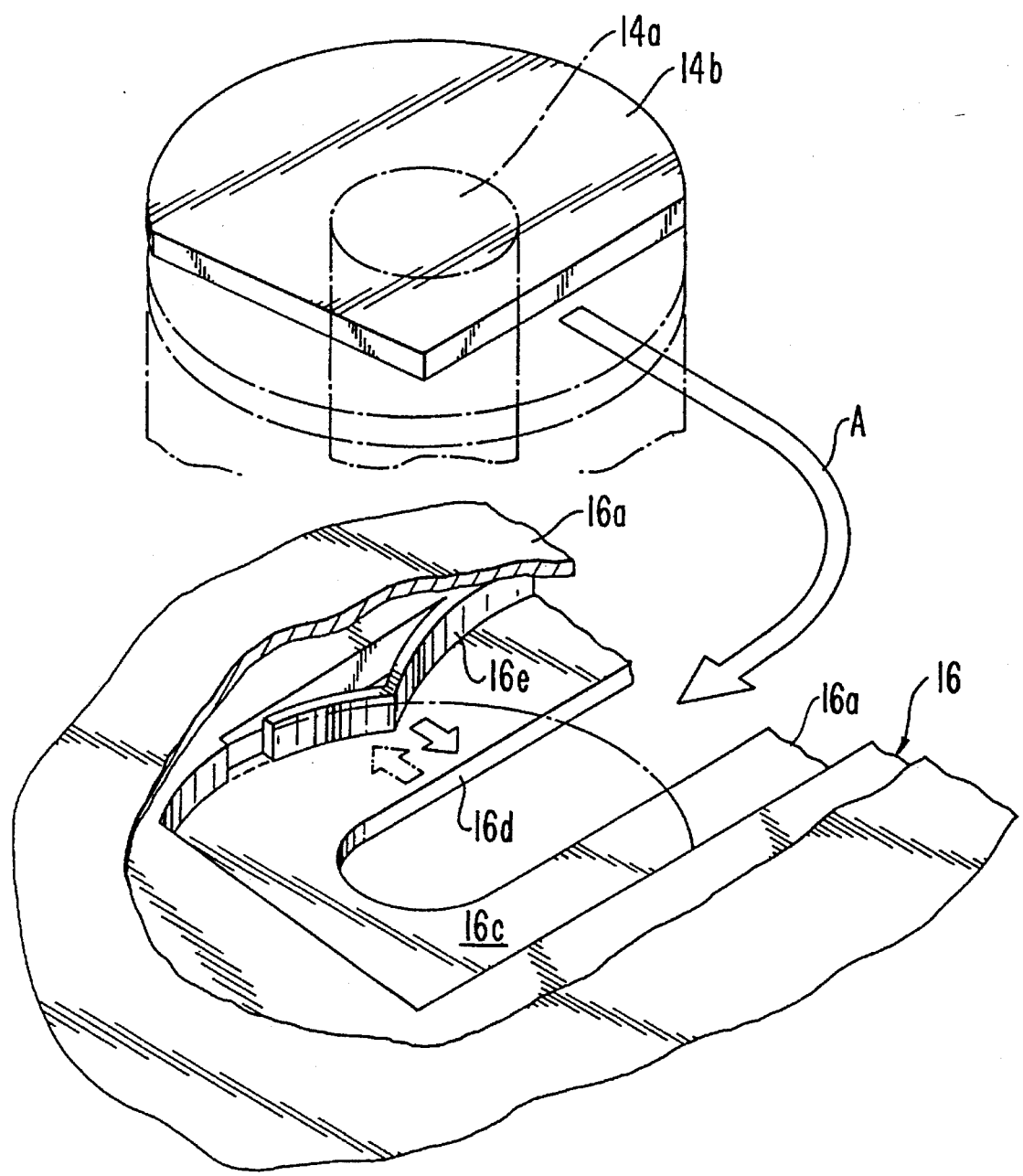
FIG. 6 is a perspective view corresponding to FIG. 3.

Referring to FIGS. 4 to 6, a modification of the first embodiment according to the present invention is shown. In this modified embodiment, two cutaway surfaces $14C_1$ and $14C_2$ are formed in the topmost heat radiating fin 14*b*, with these cutaway surfaces forming a right angle with each other. The inner end 16*f* of the cavity 16*c* formed in the plate-shaped member 16 is formed as a flat surface which conforms with the cutaway surface $14C_2$. When the topmost heat radiating fin 14*b* is completely accommodated in the cavity 16*c* of the plate-shaped member 16, the rotation or change in position of the heat radiating fin 16*b* is constrained by the two cutaway surfaces $14C_1$ and $14C_2$, so the orientation of the semiconductor device with respect to the plate-shaped member 16 is more secure than in the first mentioned embodiment.

Figure 7:
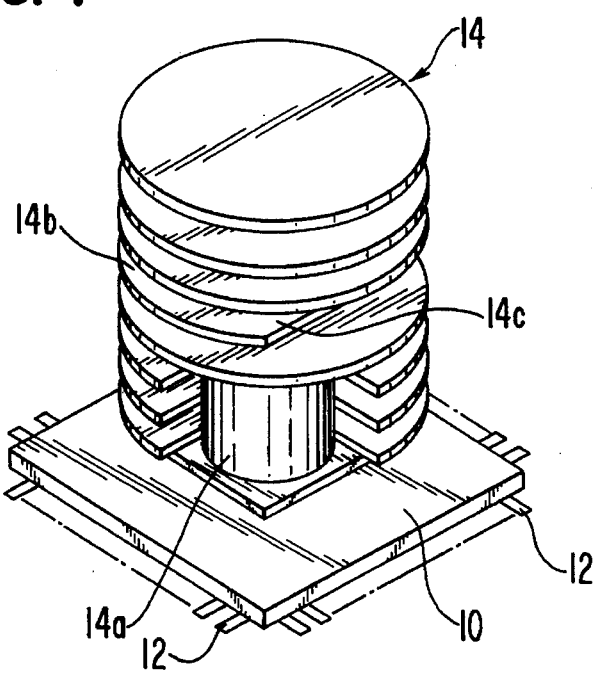
FIG. 7 is a perspective view similar to FIG. 1 and showing another modified embodiment of the semiconductor device of FIG. 1.
Figure 8:
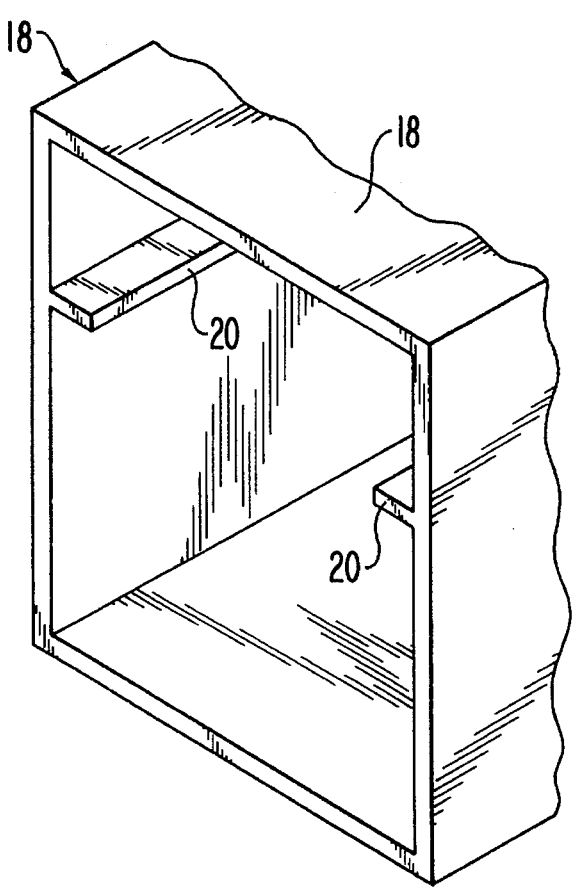
FIG. 8 is a perspective view of a part of the box-shaped container for accommodating and holding the semiconductor device of FIG. 7.

Referring to FIG. 7, another modification of the first embodiment according to the present invention is shown. In this modified embodiment, the cutaway surface 14*c* is formed, not at the topmost heat radiating fin, but rather at an intermediate heat radiating fin 14*d*. Such an intermediate heat radiating fin 14*d* may be provided with a plate-shaped member 16 as shown in FIG. 2 and FIG. 3. FIG. 8 illustrates a box-shaped container 18 for accommodating and holding the semiconductor device of FIG. 7. In this box-shaped container 18, the distance between the guide elements 20 and the top wall 18*a* is somewhat larger than the distance between the topmost heat radiating fin and the intermediate heat radiating fin 14*d*. This enables the semiconductor device of FIG. 7 to be accommodated and held in the box-shaped container 18.

Figure 9:
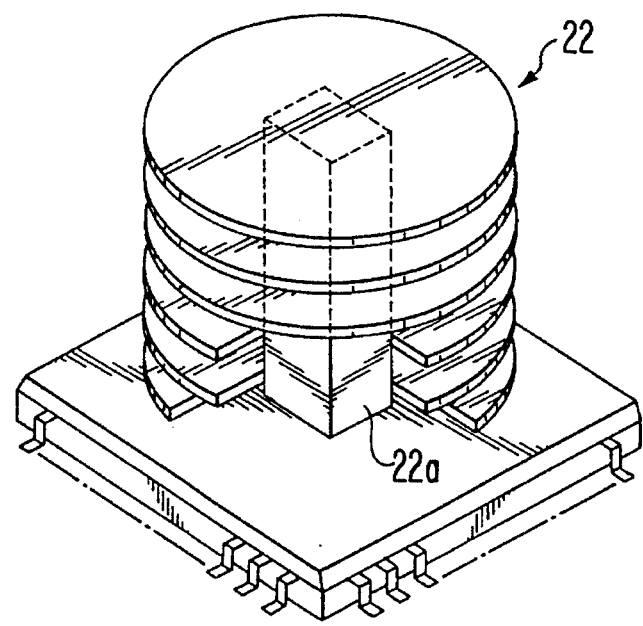
FIG. 9 is a perspective view of a second embodiment of the semiconductor device according to the present invention.
Figure 10:
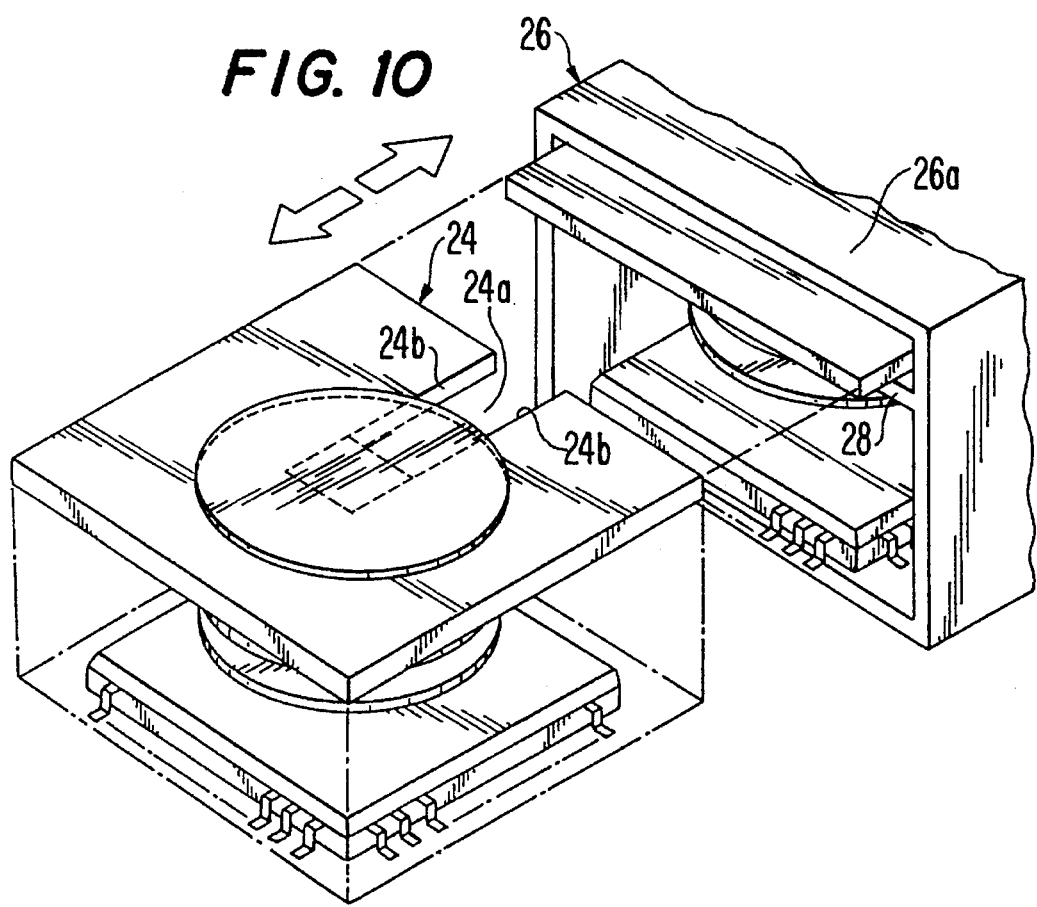
FIG. 10 is a perspective view of a plate-shaped member mounted on the support column of the heat radiating fin assembly of FIG. 9 and a portion of the box-shaped container for accommodating and holding the semiconductor device of FIG. 9.

Referring to FIG. 9 and FIG. 10, a second embodiment of the semiconductor device according to the present invention is shown. In this embodiment, the heat radiating fin assembly 22 is constituted in the same way as the assembly 14 the above-mentioned first embodiment, but the support column 22*a* is provided with a rectangular-lateral cross-section different from the above-mentioned embodiment, as is clear from FIG. 9. As shown in FIG. 10, the plate-shaped member 24 is comprised of a simple rectangular plate element 24*a*.

The rectangular plate element 24*a* is also preferably formed from a hard plastic material. The plate-shaped member 24 has a cutaway portion 24*a* formed in it, which cutaway portion 24*a* extends from the center location at one side of the plate-shaped member past the center. The width of the cutaway portion 24*a* is somewhat larger than the width of the support column 22*a* of the heat radiating fin 22, therefore the support column 22*a* can be inserted the cutaway portion 24*a*. Thus, the plate-shaped member 24 can be mounted on the assembly 22 with the support column 22*a* located in cutaway portion 24*a* and with the member 24 itself disposed between the topmost heat radiating fin and next lower heat radiating fin as shown in FIG. 10. The point to be noted here is that the two side walls 24*b* forming the cutaway portion 24*a* are disposed so as to be engaged with the opposing surfaces of the support column 22*a*, so the support column 22*a* cannot rotate or change in position in the cutaway portion 24*a*. That is, by accommodating the support column in the cutaway portion 24*a*, the package body may be oriented in the predetermined direction at all times with respect to the plate-shaped member 24.

The box-shaped container 26 for accommodating and holding the semiconductor device of FIG. 9 may also be constructed similarly to the container 18 of the first embodiment. The distance between the top wall 26*a* of the box-shaped container 26 and the guide elements 28 is large enough so that the plate-shaped member 24 may be accommodated. Further, in the same way as in the first embodiment, the outer dimensions of the plate-shaped member 24 are larger than the outer dimensions of the lead array comprised of the large number of leads. A suitable snap engagement means (not shown) is provided at one or both of the side walls 24*b* of the cutaway portion 24*a*, by which it is possible to hold the support column 22*a* in a position where it is completely accommodated in the cutaway portion 24*a*.

Therefore, even in the second embodiment shown in FIG. 9 and FIG. 10, the leads of the semiconductor devices can be protected from damage and a plurality of semiconductor devices may be accommodated and held in the box-shaped container 26 and oriented in the same direction.

In the second embodiment, a rectangular lateral cross-section is provided for the support column 22*a* as a whole, but it is also possible to provide a lateral sectional shape to just a part of it and to mount the plate-shaped member 24 at that point. Further, instead of the support column 22*a* with the rectangular cross-section, it is also possible to use a support column with a circular cross-section having a diameter larger than the width of the cutaway portion 24*a*. In this case, a pair of parallel grooves may be formed at opposite sides of the circular section support column in the direction of its diameter and the two side walls 24*b* of the cutaway portion 24*a* may be engaged with the pair of parallel grooves.

Figure 11:
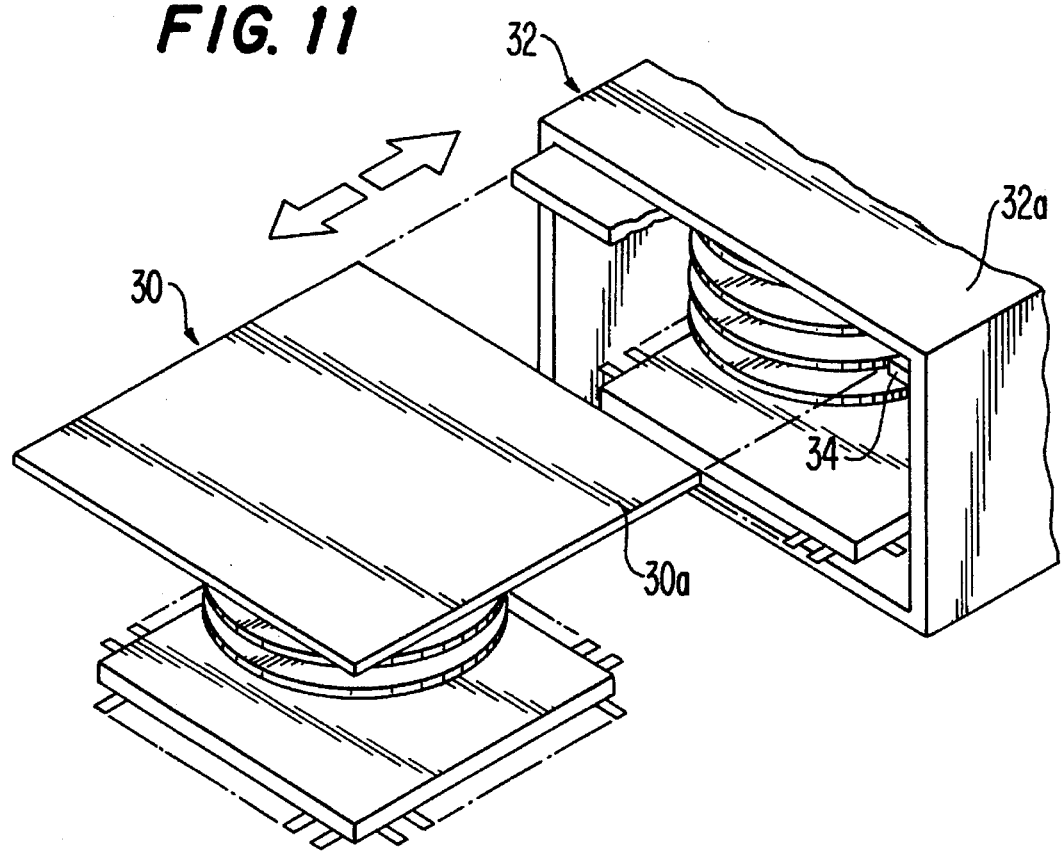
FIG. 11 is a perspective view showing a third embodiment of the semiconductor device according to the present invention.

Referring to FIG. 11, a third embodiment of a semiconductor device according to the present invention will be shown. In this embodiment also, the heat radiating fin assembly 30 is constructed in a similar fashion as the assembly 14 of the first embodiment explained above, but in this case the topmost heat radiating fin 30*a* is formed in a block-shape having outer dimensions which are larger than the outer dimensions of the lead array formed by the large number of leads projecting out from the package body of the semiconductor device. The box-shaped container 32 may also be formed similarly to the container 18 of the first embodiment, but the distance between the top wall 32*a* and the guide elements 34 is of a size enabling accommodating of the heat radiating fin 30a. Therefore, when the heat radiating fin 30a is accommodated between the top wall 32a and the guide elements 34, the opposing lateral edges of the heat radiating fin 30 are engaged with the inside surfaces of the side walls of the box-shaped container 32, and therefore the heat radiating fin 30a cannot rotate or move in position in the box-shaped container 32. That is, once the heat radiating fin 30a is accommodated in the box-shaped container 32, the orientation of the heat radiating fin 30a will not change. Therefore, a plurality of semiconductor devices may be accommodated and held in the box-shaped container 32 and may all be oriented in the same direction. In summary, the heat radiating fin 30a has the same function as the plate-shaped member 16 of the first embodiment mentioned above.

Figure 12:
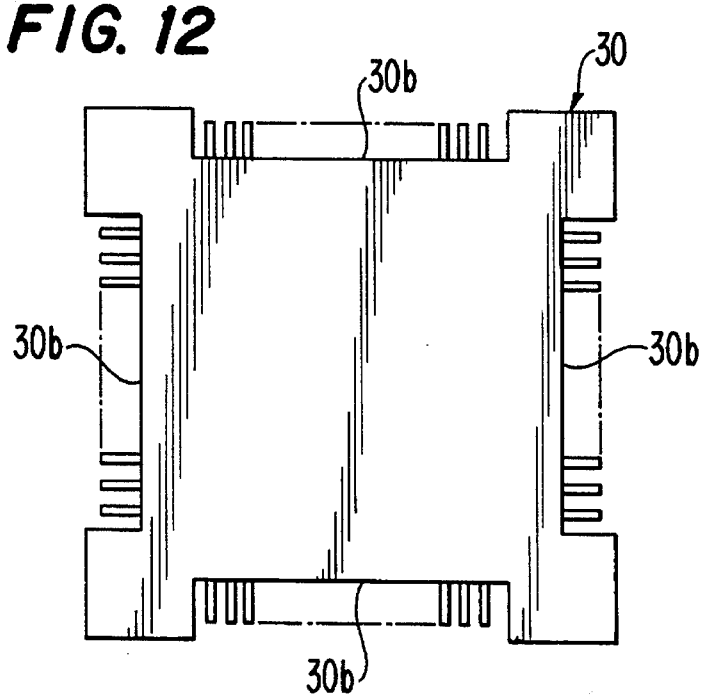
FIG. 12 is a plan view of a modification of the plate-shaped member of FIG. 11.
Figure 13:
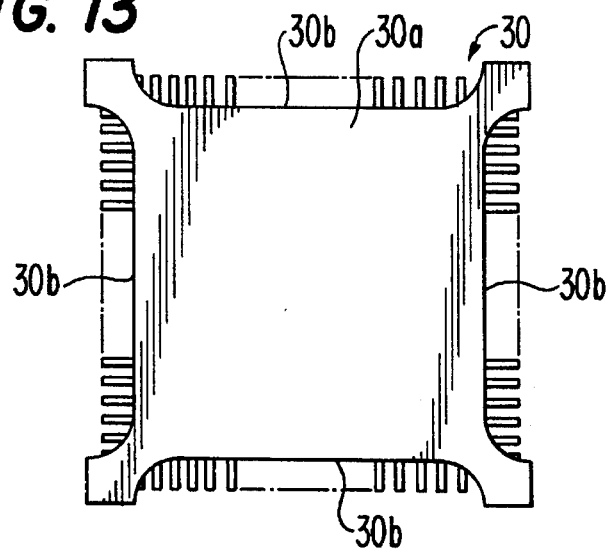
FIG. 13 is a plan view of another modification of the plate-shaped member of FIG. 11.

Referring to FIG. 12, a modification of the rectangular heat radiating fin 30a is shown. In this modification, cutaway portions 30b are formed at the sides of the heat radiating fin 30a along the intermediate regions of the same. The contour lines inside the cutaway portions 30b are positioned at the inward regions of the contour shape of the lead array. If this is done, then when the semiconductor device is mounted on a printed circuit board, the majority of the lead connections can be observed through the cutaway portions 30b, so the heat radiating fin of FIG. 12 is advantageous in the case of inspection of the lead connections. When two semiconductor devices having such heat radiating fins are accommodated and held in the box-shaped container 32, the respective heat radiating fins abut against each other at the corner regions, so there is no contact between the outwardly projecting groups of leads of two adjoining package bodies. FIG. 13 shows another modification of the rectangular heat radiating fin 30 of FIG. 12. In this modification, the cutaway portions 30b are wider than in FIG. 12.

Figure 14:
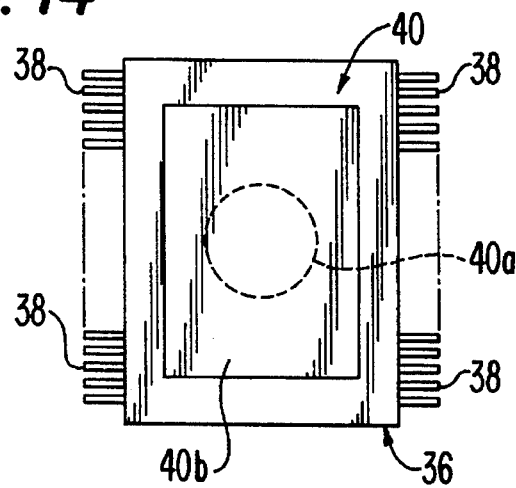
FIG. 14 is a plan view of a fourth embodiment of the semiconductor device according to the present invention.
Figure 15:
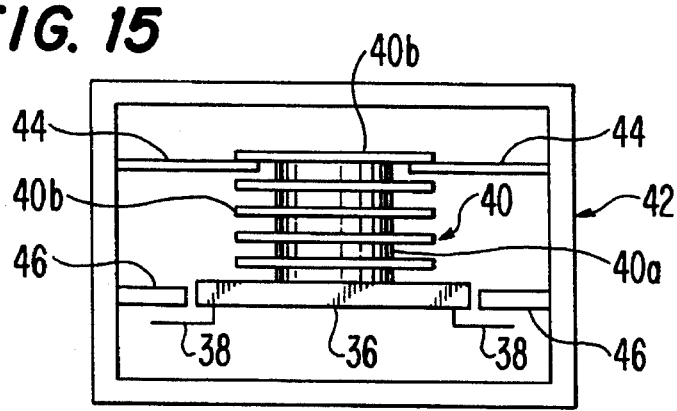
FIG. 15 is an elevational view of the box-shaped container for accommodating and holding the semiconductor device of FIG. 14.

Referring to FIG. 14 and FIG. 15, a fourth embodiment of the semiconductor device according to the present invention is shown. The semiconductor device is of the type generally known as the SOP (small outline package). This type of semiconductor device also is constructed of a rectangular package body 36 in which the IC chip is sealed, a large number of leads 38 project out from the opposing sides of the package body 36, and a heat radiating fin assembly 42 is mounted at the top surface of the package body 36. In the same way, the package body is formed, for example, from a plastic material or a ceramic material.

In this embodiment also, the heat radiating fin assembly 40 is constructed of a support column 40a extending vertically from the top surface of the package body 36 and a plurality of heat radiating fins 40b extending integrally from the support column 40a in the radial direction and arranged at equal intervals along the axial direction of the support column 40a. In this case the heat radiating fins 40b are shaped, not circularly, but as rectangles. The support column 40a and the heat radiating fins 40b are formed from metallic materials having excellent heat conductivity in the same way as in the above-mentioned embodiments, for example, from aluminum and copper, and the support column 14a is, for example, soldered to a partially exposed metal surface at the top surface of the package body 10. In this embodiment, the outer dimensions of the heat radiating fins 40b are smaller than the outer dimensions of the package body 36.

In FIG. 15, the semiconductor device of FIG. 14 is shown as being accommodated and held in the box-shaped container 42. Guide elements 44 are provided at the inside surfaces of the two side walls of the box-shaped container 42 along the longitudinal axial direction of the same. The lateral space between the projecting tips 44a of the guide elements 44 is smaller than the lateral width of the heat radiating fins 40b and therefore the projecting tips 44a of the guide elements 44 can be inserted between the topmost heat radiating fin 40b and the heat radiating fin directly therebeneath. Therefore, the semiconductor devices are hung from the guide elements 44, so that the leads 38 are out of contact with the inside surface of the bottom wall of the box-shaped container 42. However, with such a holding mechanism for the package body 36, the package body 36 can rotate and move in position in the box-shaped container 42, so it is not possible to orient all the semiconductor devices in the box-shaped container in the same direction.

Therefore, in this embodiment, projecting elements 46 are provided at the inside surfaces of the two side walls of the box-shaped container 42 along the longitudinal axial direction of the same. These projecting elements 46 are arranged at positions at the same level as the package body 36 when the semiconductor devices are hung from the guide elements 44. The projecting tips 46a of the projecting elements 46 may be positioned close to the two opposing side surfaces of the package body 36, so that the rotation and movement of the package body 36 can be substantially prevented. That is, once the semiconductor device 40 is accommodated and held in the container 42, the orientation of the semiconductor device 40 will not change. Thus, a plurality of semiconductor devices may be accommodated and held in the box-shaped container 42 and may all be oriented in the same direction.

Figure 16:
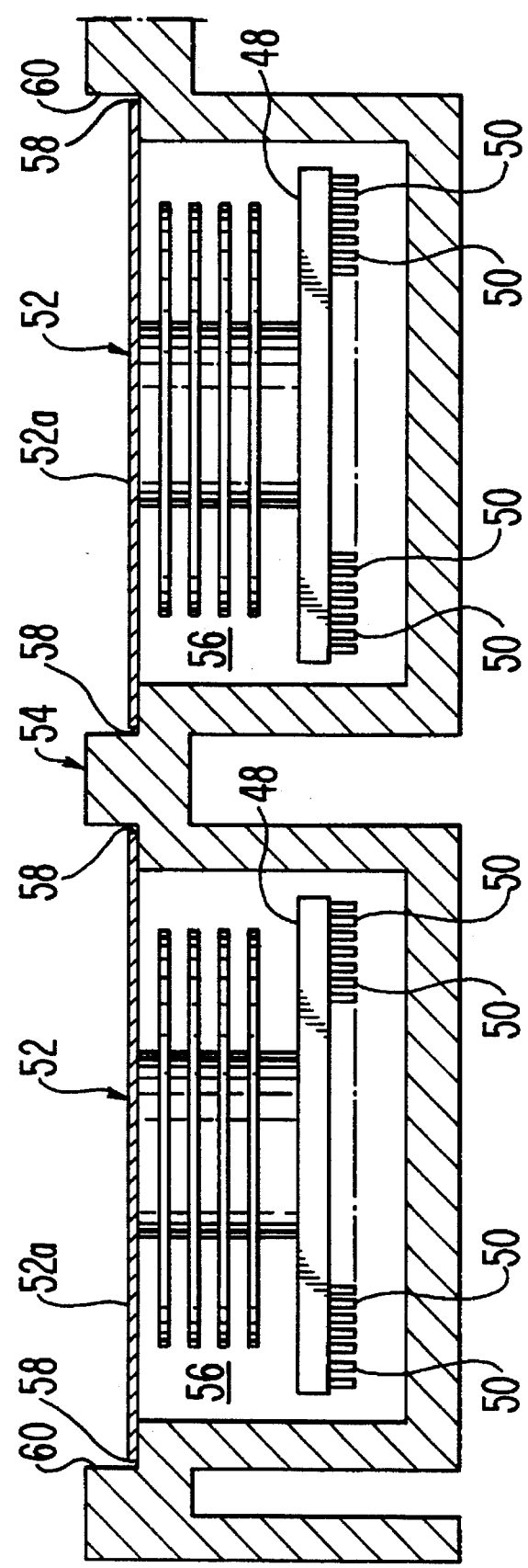
FIG. 16 is a sectional view taken along the line XVI—XVI of FIG. 17A showing a fifth embodiment of the semiconductor device according to the present invention.
Figure 17A:
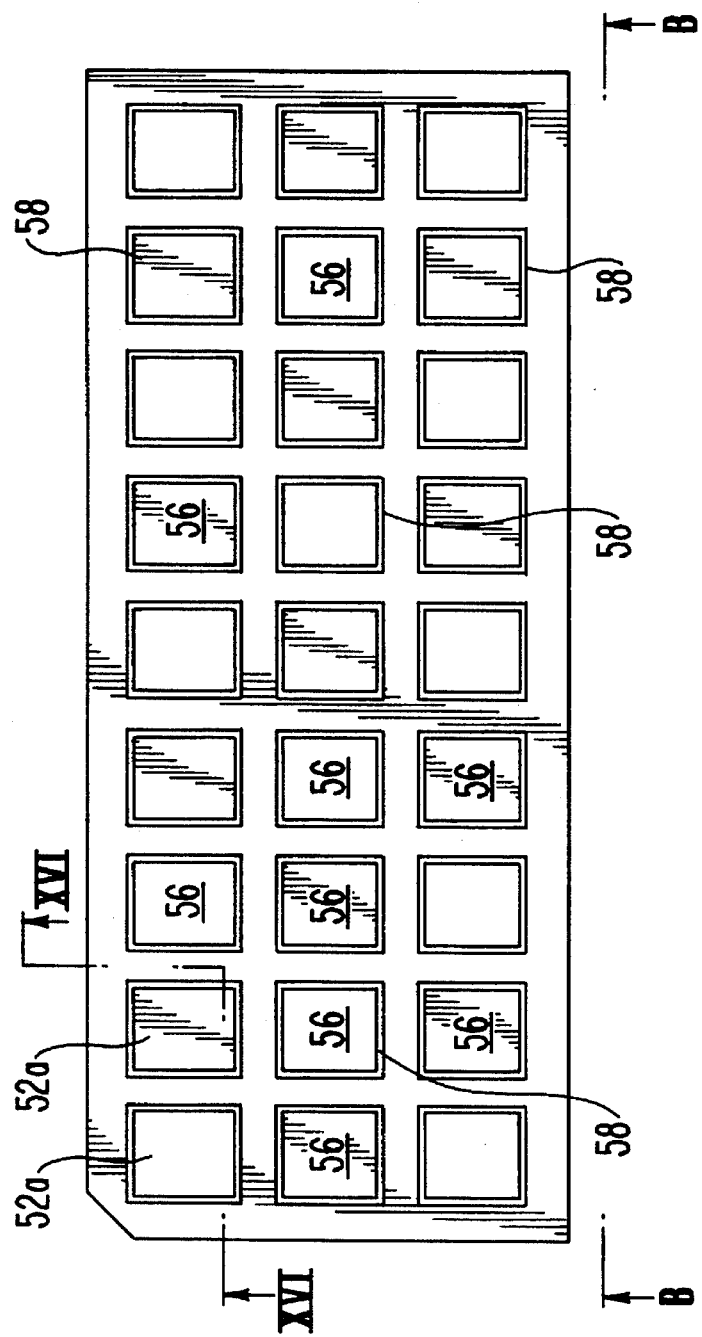
FIG. 17A is a plan view of the tray for accommodating and holding the semiconductor device according to the present invention.
Figure 17B:
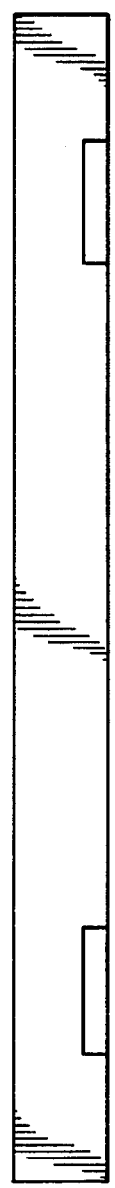
FIG. 17B is an elevational view taken along line B—B of FIG. 17A.

Referring to FIG. 16, FIG. 17A, and FIG. 17B, a fifth embodiment of the semiconductor device according to the present invention is shown. This semiconductor device is of the type generally known as a PGA (pin grid array package). This type of semiconductor device also is constructed of a rectangular package body 48 in which an IC chip is sealed, a large number of leads 50 projecting out from the bottom of the package body 48, and a heat radiating fin assembly 52 mounted at the top surface of the package body 48. The package body 48 is formed from a plastic material or ceramic material etc. in the same way as the previous embodiments. The heat radiating fin assembly 52 has substantially the same form as the heat radiating fin assembly shown in FIG. 11. That is, the topmost heat radiating fin 52a of the heat radiating fin assembly 52 has a rectangular shape, but the other heat radiating fins may be circular. The outer dimensions of the rectangular heat radiating fin 52a are larger than the outer dimensions of the contour shape of the package body 48.

In this embodiment, use may be made of the tray 54 as the container for accommodating the semiconductor devices. The tray 54 as a whole is shown in FIG. 17A and FIG. 17B. Such a tray may be formed as an integrally shaped article of, for example, a hard plastic material. As shown in FIG. 16, small chambers, that is, depressions 56, are formed in the tray 54. At the edges surrounding the depressions 56 are formed shoulders 58. When semiconductor devices are accommodated in the depressions 56, the surrounding edges of the rectangular heat radiating fins 52a are placed on the shoulders 58, whereby the semiconductor devices are suspended from the shoulders 58, so the leads 50 are kept out of contact with the bottom of the depressions 56. Further, as best illustrated in FIG. 16, the rectangular dimensions of the vertical surrounding walls 60 defining the shoulders 58 are just slightly larger than the rectangular dimensions of the rectangular heat radiating fins 52a of the heat radiating fin assembly 52, so once a semiconductor device is accommodated and held in a depression 56, the movement of the semiconductor device is substantially constrained by the vertical surrounding walls 60. Therefore, all of the semiconductor devices accommodated and held in the depressions 56 in the try 54 may be oriented in the same direction. When transporting the semiconductor devices by the tray 54, the tray 54 is closed by a closing cover (not shown), which cover is fixed in place by a suitable clamping means. In this case, it is preferable that the a sponge piece or the like be attached to the rear side of the cover at each depression 56 so as to prevent any slight movement of the semiconductor devices.

Finally, needless to say, the semiconductor devices of the fifth embodiment mentioned just above may be accommodated and held in a box-shaped container as shown in FIG. 11 in accordance with need. Moreover, the semiconductor devices of the first, second, and third embodiments may be accommodated and held in the depressions of a tray as shown in FIG. 16. In the semiconductor device of the fifth embodiment, the rectangular heat radiating fin may be of the same form as the heat radiating fin below it. In this case, the semiconductor device of the fifth embodiment may be accommodated in a box-shaped container as shown in FIG. 15. Furthermore, the topmost heat radiating fin of the heat radiating fin assembly 40 may be extended so as to be accommodated and held in the depressions of the tray of in FIG. 16.

I claim:

1. An article of manufacture comprising:

a package body having several sides and containing a semiconductor device;

a plurality of leads projecting laterally outwardly from at least one of said sides presenting a lead array for said device; and a heat radiating fin assembly mounted on said package body, said fin assembly being configured to permit and accommodate the holding of said package body in a receiving container, said fin assembly being provided with protective and orientation structure for protecting the lead array and causing the package body to have a predetermined orientation when the package body is accommodated and held in a receiving container, said fin assembly comprising an elongated, vertically extending support column and a radially extending fin affixed to said column, said protective and orientation structure comprising a plate-shaped member detachably mounted on said fin, said plate-shaped member having an extended portion which extends laterally outwardly beyond the array, said plate-shaped member being supported by engagement of said extended portion with a receiving container, said structure further comprising a first orientation surface on said assembly and a second orientation surface on said member, said first and second surfaces engaging to establish the orientation of the package body relative to the member, said structure also comprising a third orientation surface on said member, said third surface engaging a corresponding surface of a receiving container for establishing the orientation of the member and therefore the package body within the container.

2. An article of manufacture as set forth in claim 1, wherein said first surface is on said column.

3. An article of manufacture as set forth in claim 1, wherein said first surface is on said fin.

4. An article of manufacture comprising:

a package body having several sides and containing a semiconductor device;

a plurality of leads projecting laterally outwardly from at least one of said sides presenting a lead array for said device; and a heat radiating fin assembly mounted on said package body, said fin assembly being configured to permit and accommodate the holding of said package body in a receiving container, said fin assembly being provided with protective and orientation structure for protecting the lead array and causing the package body to have a predetermined orientation when the package body is accommodated and held in a receiving container, said fin assembly comprising an elongated vertically extending support column and a radially extending fin, said structure comprising an outer peripheral segment of said fin, said segment having an extended portion which extends laterally outwardly beyond the array, said segment being supported by engagement between said extended portion and a receiving container, said structure comprising an orientation surface on said assembly which engages a corresponding surface of a receiving container for establishing the orientation of the package body within the container with respect to a rotational direction about a longitudinal axis of said support column such that said package body is prevented from being rotated around said axis.

5. An article of manufacture as set forth in claim 4, wherein the extended portion has a cut away area which facilitates observation and visual inspection of the lead array.

6. An article of manufacture comprising:

a package body having several sides and containing a semiconductor device;

a plurality of leads projecting laterally outwardly from at least one of said sides presenting a lead array for said device;

a heat radiating fin assembly mounted on said package body, said fin assembly being configured to permit and accommodate the holding of said package body in a receiving container, said fin assembly being provided with protective and orientation structure for protecting the lead array and causing the package body to have a predetermined orientation when the package body is accommodated and held in a receiving container, said fin assembly comprising an elongated, vertically extending support column and a radially extending fin affixed to said column, said protective and orientation structure comprising a plate-shaped member detachably mounted on said fin, said plate-shaped member having an extended portion which extends laterally outwardly beyond the array, said structure further comprising a first orientation surface on said assembly and a second orientation surface on said member, said first and second surfaces engaging to establish the orientation of the package body relative to the member; and a receiving container accommodating the package body, said container having an elongated box-shaped configuration presenting a pair of opposed, spaced, vertical, longitudinally extending internal side surfaces and an open end, there being a respective horizontally extending guide element on each of said side surfaces, said plate-shaped member and therefore said package body being supported in said container by engagement of said extended portion with said guide elements, said structure also comprising a third orientation surface on said member, said third surface engaging a corresponding surface of said container for establishing the orientation of the member and therefore the package body within said container.

7. An article of manufacture comprising:

a package body having several sides and containing a semiconductor device;

a plurality of leads projecting laterally outwardly from at least one of said sides presenting a lead array for said device;

a heat radiating fin assembly mounted on said package body, said fin assembly being configured to permit and accommodate the holding of said package body in a receiving container, said heat radiating assembly being provided with protective and orientation structure for protecting the lead array and causing the package body to have a predetermined orientation when the package body is accommodated and held in a receiving container, said fin assembly comprising an elongated, vertically extending support column and a radially extending fin affixed to said column, said protective and orientation structure comprising a plate-shaped member detachably mounted on said fin, said plate-shaped member having an extended portion which extends laterally outwardly beyond the array, said structure further comprising a first orientation surface on said assembly and a second orientation surface on said member, said first and second surfaces engaging to establish the orientation of the package body relative to the member; and a receiving container accommodating the package body, said container comprising a tray having a depression therein and a shoulder disposed beside the depression, said package body being suspended in the depression of the container with the plate-shaped member supported by engagement of said extended portion with the shoulder, said structure also comprising a third orientation surface on said member, said third surface engaging a corresponding surface of said container for establishing the orientation of the member and therefore the package body within said container.

8. An article of manufacture comprising:

a package body having several sides and containing a semiconductor device;

a plurality of leads projecting laterally outwardly from at least one of said sides presenting a lead array for said device;

a heat radiating fin assembly mounted on said package body, said fin assembly being configured to permit and accommodate the holding of said package body in a receiving container, said heating radiating assembly being provided with protective and orientation structure for protecting the lead array and causing the package body to have a predetermined orientation when the package body is accommodated and held in a receiving container, said fin assembly comprising an elongated vertically extending support column and a radially extending fin, said structure comprising an outer peripheral segment of said fin, said segment having an outer extended portion which extends laterally outwardly beyond said array; and a receiving container accommodating the package body, said container having an elongated box-shaped configuration presenting a pair of opposed, spaced, vertical, longitudinally extending internal side surfaces and an open end, there being a respective horizontally extending guide element on each of said side surfaces, said package body being supported in said container by engagement of said extended portion with said guide elements, said structure comprising an orientation surface on said assembly which engages a corresponding surface of said container for establishing the orientation of the package body within said container with respect to a rotational direction about a longitudinal axis of said support column such that said package body is prevented from being rotated around said axis.

9. An article of manufacture comprising:

a package body having several sides and containing a semiconductor device;

a plurality of leads projecting laterally outwardly from at least one of said sides presenting a lead array for said device;

a heat radiating fin assembly mounted on said package body, said fin assembly being configured to permit and accommodate the holding of said package body in a receiving container, said heat radiating assembly being provided with protective and orientation structure for protecting the lead array and causing the package body to have a predetermined orientation when the package body is accommodated and held in a receiving container, said fin assembly comprising an elongated vertically extending support column and a radially extending fin, said structure comprising an outer peripheral segment of said fin, said segment having an outer extended portion which extends laterally outwardly beyond said array; and a receiving container accommodating the package body, said container comprising a tray having a depression therein and a shoulder disposed beside the depression, said package body being suspended in the depression of the container with said extended portion supported by engagement with the shoulder, said structure comprising an orientation surface on said assembly which engages a corresponding surface of said container for establishing the orientation of the package body within said container with respect to a rotational direction about a longitudinal axis of said support column such that said package body is prevented from being rotated around said axis.

10. An article of manufacture including a plurality of semiconductor structures and a receiving container for said structures, each of said structures comprising:

a package body having several sides and containing a semiconductor device;

a plurality of leads projecting laterally outwardly from at least one each of said sides presenting a lead array for said device; and a heat radiating fin assembly mounted on said package body, said fin assembly being configured to permit and accommodate the holding of said package body in said container, said heat radiating assembly being provided with protective and orientation structure for protecting the lead array and causing the package body to have a predetermined orientation in said container, said fin assembly comprising an elongated, vertically extending support column and a radially extending fin affixed to said column, said protective and orientation structure comprising a plate-shaped member detachably mounted on said fin, said plate-shaped member having an extended portion which extends laterally outwardly beyond the array, said plate-shaped member being supported by engagement of said extended portion with said container, said protective and orientation structure further comprising a first orientation surface on said assembly and a second orientation surface on said member, said first and second surfaces engaging to establish the orientation of the package body relative to the member, said protective and orientation structure also comprising a third orientation surface on said member, said third surface engaging a corresponding surface of said container for establishing the orientation of the member and therefore the package body within the container.

11. An article of manufacture as set forth in claim 10, wherein said container has an elongated box-shaped configuration presenting a pair of opposed, spaced, vertical, longitudinally extending internal side surfaces and an open end, there being a respective horizontally extending guide element on each of said side surfaces, said plate-shaped members being supported in said container by engagement of said extended portions with said guide elements.

12. An article of manufacture as set forth in claim 10, wherein said container comprises a tray having a respective depression therein for each package body and a respective shoulder disposed beside each depression, said package bodies being suspended in corresponding depressions of the container with the plate-shaped members supported by engagement with respective shoulders.

13. An article of manufacture including a plurality of semiconductor structures and a receiving container for said structures, each of said structures comprising:

a package body having several sides and containing a semiconductor device;

a plurality of leads projecting laterally outwardly from at least one of said sides presenting a lead array for said device; and a heat radiating fin assembly mounted on said package body, said fin assembly being configured to permit and accommodate the holding of said package body in a receiving container, said heat radiating assembly being provided with protective and orientation structure for protecting the lead array and causing the package body to have a predetermined orientation in said container, said fin assembly comprising an elongated vertically extending support column and a radially extending fin, said protective and orientation structure comprising an outer peripheral segment of said fin, said segment having an outer extended portion which extends laterally outwardly beyond said array, said segment being supported by engagement between said extended portion and said container, said protective and orientation structure comprising an orientation surface on said assembly which engages a corresponding surface of said container for establishing the orientation of the package body within the container with respect to a rotational direction about a longitudinal axis of said support column such that said package body is prevented from being rotated around said axis.

14. An article of manufacture as set forth in claim 13, wherein said container has an elongated box-shaped configuration presenting a pair of opposed, spaced, vertical, longitudinally extending internal side surfaces and an open end, there being a respective horizontally extending guide element on each of said side surfaces, said plate-shaped members being supported in said container by engagement of said outer extended portion with said guide elements.

15. An article of manufacture as set forth in claim 13, wherein said container comprises a tray having a respective depression therein for each package body and a respective shoulder disposed beside each depression, said package bodies being suspended in corresponding depressions of the container with the plate-shaped members thereof supported by engagement with the adjacent shoulder.

* * * * *